(12) United States Patent
Daga et al.

(10) Patent No.: US 8,335,976 B2
(45) Date of Patent: Dec. 18, 2012

(54) MEMORY SYSTEM THAT PROVIDES GUARANTEED COMPONENT-FAILURE CORRECTION WITH DOUBLE-ERROR CORRECTION

(75) Inventors: Bharat K. Daga, Fremont, CA (US); Robert E. Cypher, Saratoga, CA (US)

(73) Assignee: Oracle America, Inc., Redwood Shores, CA (US)

( * ) Notice: Subject to any disclaimer, the term of this patent is extended or adjusted under 35 U.S.C. 154(b) by 282 days.

(21) Appl. No.: 12/785,633

(22) Filed: May 24, 2010

(65) Prior Publication Data

US 2011/0289381 A1   Nov. 24, 2011

(51) Int. Cl.
*H03M 13/00* (2006.01)

(52) U.S. Cl. ........ 714/785; 714/753; 714/758; 714/784; 714/799

(58) Field of Classification Search .................. 714/753, 714/758, 781, 799, 784, 785
See application file for complete search history.

(56) References Cited

U.S. PATENT DOCUMENTS

| | | | | |
|---|---|---|---|---|
| 5,369,650 | A * | 11/1994 | Kirk et al. ...................... | 714/765 |
| 5,623,506 | A * | 4/1997 | Dell et al. ...................... | 714/766 |
| 6,536,009 | B1 * | 3/2003 | Bodnar ........................... | 714/762 |
| 6,574,768 | B2 * | 6/2003 | Cypher ........................... | 714/758 |
| 6,745,363 | B2 * | 6/2004 | Poirier et al. .................. | 714/763 |
| 7,188,296 | B1 | 3/2007 | Cypher | |
| 7,278,085 | B1 * | 10/2007 | Weng et al. .................... | 714/766 |
| 8,051,337 | B2 * | 11/2011 | Chen ............................... | 714/53 |

\* cited by examiner

*Primary Examiner* — Esaw Abraham
(74) *Attorney, Agent, or Firm* — Park, Vaughan, Fleming & Dowler LLP

(57) ABSTRACT

A memory system accesses a block of data, each block including bits logically divided into rows and columns, each column including a row-checkbit column, an inner-checkbit column, and data-bit columns. Each column is stored in a different memory component, and checkbits are generated from databits to provide block-level correction for a failed memory component, and double-error correction for errors in different memory components. The system calculates a row syndrome and an inner syndrome for the block of data, the inner syndrome resulting from any two-bit error in the same row being unique. The system can use the row and inner syndromes to determine whether errors are associated with a failed memory component. If not, the system can use the row and inner syndromes, and inner syndromes for all possible combinations of one-bit errors occurring in two rows with a row syndrome of one to correct two bits.

20 Claims, 7 Drawing Sheets

MEMORY SYSTEM THAT PROVIDES GUARANTEED COMPONENT-FAILURE CORRECTION WITH DOUBLE-ERROR CORRECTION

BACKGROUND

1. Field

The present invention generally relates to error-detection and error-correction mechanisms in computer memories. More specifically, the present invention relates to a computer system memory that supports guaranteed component-failure correction and double-error correction.

2. Related Art

Computer systems routinely employ error-detecting and error-correcting codes to detect and/or correct various data errors which are caused, for example, by noisy communication channels and unreliable storage media. Some error-detecting and error-correcting codes, such as single-error correction, double-error detection (SECDED) Hamming codes, can be used to correct single-bit errors and detect double-bit errors.

Other codes, which are based on Galois fields, can be used to correct a special class of multi-bit errors caused by a failure of an entire memory component. For example, see U.S. Pat. No. 7,188,296, entitled "ECC for Component Failures Using Galois Fields," by inventor Robert E. Cypher, filed 30 Oct. 2003 (referred to herein as the "'296 patent"). The technique described in the '296 patent can "detect" double-bit errors which occur prior to a memory component failure. However, the technique cannot "correct" such double-bit errors. To provide higher levels of memory system reliability, it is desirable to be able to correct such double-bit errors.

SUMMARY

The disclosed embodiments relate to a memory system that provides guaranteed component-failure correction and double-error correction. During operation, the memory system accesses a block of data, wherein each block of data in the memory system includes an array of bits logically organized into R rows and C columns. The C columns include (1) a row checkbit column containing row checkbits for each of the R rows, (2) an inner checkbit column containing R inner checkbits, and (3) C-2 data-bit columns containing databits. In addition, each column is stored in a different memory component, and the checkbits are generated from the databits to provide block-level correction for a failed memory component, and double-error correction for errors in different memory components. Next, the system calculates a row syndrome and an inner syndrome for the block of data, wherein the inner syndrome that results from any two-bit error in the same row is unique. If the row syndrome and the inner syndrome are both non-zero, the system determines from the row syndrome and the inner syndrome whether errors in the block of data are associated with a failed memory component. If not, and if exactly two bits in the row syndrome are one, the system assumes that there exists a single-bit error in each of the two rows which have a row syndrome of one, and compares the calculated inner syndrome against inner syndromes for all possible combinations of one-bit errors occurring in each of the two rows. Then, if the comparison matches a given inner syndrome, the system corrects the two bits associated with the given inner syndrome.

In some embodiments, if the row syndrome and the inner syndrome are both zero, the system determines that the block of data is error-free.

In some embodiments, if the row syndrome is non-zero and the inner syndrome is zero, the system determines that erroneous bits only exist in the row-checkbit column, and the system uses the row syndrome to identify and correct the erroneous bits.

In some embodiments, if the row syndrome is zero and the inner syndrome is non-zero, the system assumes that two single-bit errors exist in the same row. The system then compares the inner syndrome against unique inner syndromes for all possible two-bit errors in the same row. If the inner syndrome matches a unique inner syndrome for a two-bit error in the same row, the system corrects the two-bit error. Otherwise, the system determines that the block of data cannot be corrected.

In some embodiments, if the inner syndrome does not match any of the inner syndromes for all possible combinations of one-bit errors occurring in each of the two rows, the system determines that the block of data cannot be corrected.

In some embodiments, if the errors in the block of data are not associated with a failed memory component, and if the row syndrome does not have exactly two bits set to one, the system determines that the block of data cannot be corrected.

In some embodiments, if the system determines that the given memory component has failed, the system uses the row syndrome to identify erroneous bits in the given column associated with the given memory component. The system then flips the identified erroneous bits to correct the given column.

In some embodiments, while calculating the row syndrome and the inner syndrome, the system regenerates the row-parity bits and the inner checkbits for the block of data from the databits in the block of data. Next, the system computes the row syndrome by exclusive-ORing the regenerated row-parity bits with the existing row-parity bits. The system then computes the inner syndrome by exclusive-ORing the regenerated inner checkbits with the existing inner checkbits.

In some embodiments, the row checkbit column contains row-parity bits for each of the R rows in the block of data. Moreover, the inner checkbit column contains R inner checkbits which are defined to cover bits in the array in accordance with a set of check vectors. Each of these check vectors is associated with a different bit in the array and is an element of a Galois field (GF($2^X$)). Moreover, the check vectors are derived from a set of keys which are unique elements of GF($2^X$), wherein each key is associated with a different column of the array, wherein the check vector for a row R of a column C is the product in GF($2^X$) of the key for the column c and $\alpha^r$, and wherein $\alpha$ is a primitive element of GF($2^X$).

In some embodiments, the set of keys are elements of a subfield of G($2^X$), wherein the subfield does not contain any $\alpha^i$, where $1 \leq i < R$.

In some embodiments, the system determines from the row syndrome and the inner syndrome whether errors in the block of data are associated with a failed memory component by performing a division operation in GF($2^X$) of the inner syndrome by the row syndrome. If the result of the division operation matches a key associated with a given column, the system determines that a given memory component associated with the given column has failed.

In some embodiments, the system determines from the row syndrome and the inner syndrome whether errors in the block of data are associated with a failed memory component by performing multiplication operations in GF($2^X$) between the row syndrome and each key in the set of keys. Next, the system compares the inner syndrome against results of the multiplication operations. If the inner syndrome matches a result, the system determines that the key associated with the result is the key for the column associated with the failed memory component.

Figure 1:
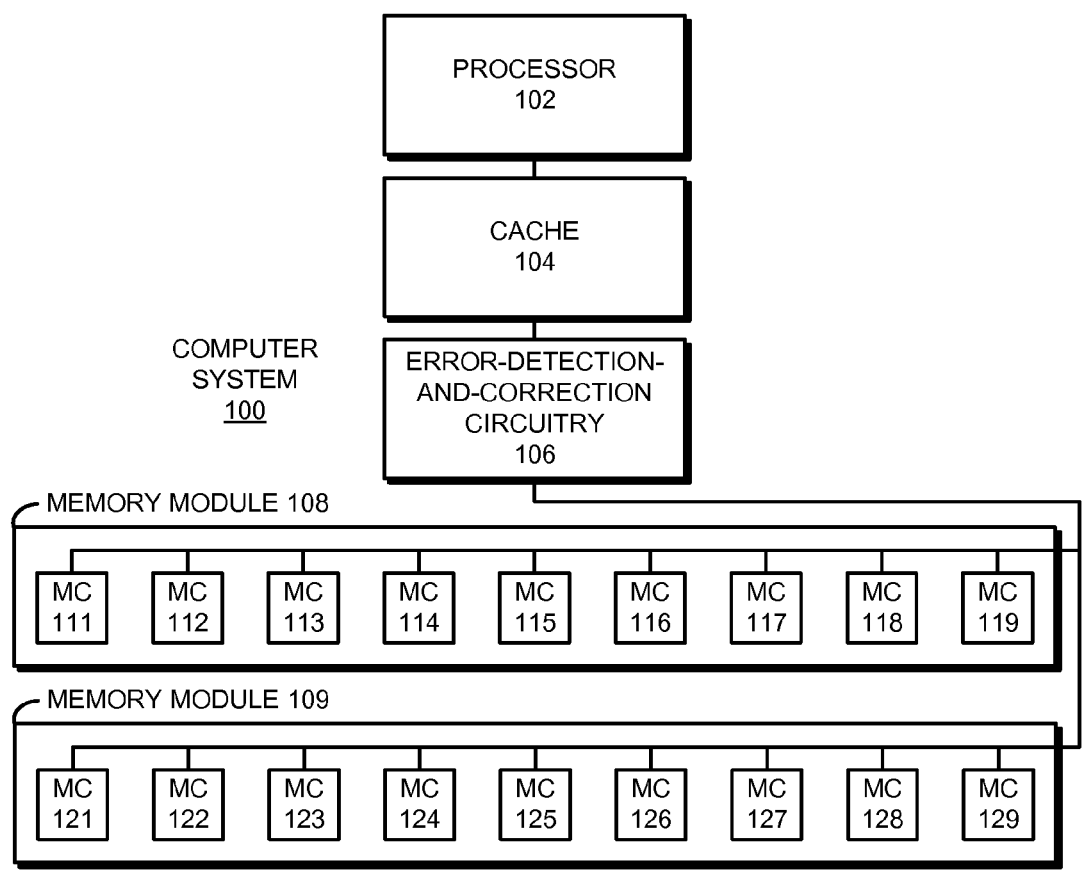
FIG. 1 illustrates a computer system in accordance with an embodiment of the present invention.

Table 1 presents an exemplary set of keys for a block of data with 32 rows and 18 columns in accordance with an embodiment of the present invention.

DETAILED DESCRIPTION

The following description is presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the disclosed embodiments. Thus, the disclosed embodiments are not limited to the embodiments shown, but are to be accorded the widest scope consistent with the principles and features disclosed herein.

The data structures and code described in this detailed description are typically stored on a non-transitory computer-readable storage medium, which may be any device or medium that can store code and/or data for use by a computer system. The non-transitory computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing code and/or data now known or later developed.

The methods and processes described in the detailed description section can be embodied as code and/or data, which can be stored in a non-transitory computer-readable storage medium as described above. When a computer system reads and executes the code and/or data stored on the non-transitory computer-readable storage medium, the computer system performs the methods and processes embodied as data structures and code and stored within the non-transitory computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Overview

The present invention relates to a memory system that provides error-detection and -correction mechanisms for both component failures and double-bit errors. Specifically, prior to an identified component failure, the system supports double-error correction (DEC) and guaranteed component failure correction. Once a component has failed, the system can correct any number of errors on the failed component plus any single-bit error in another component.

The present invention requires fewer checkbits than are required by existing systems that provide the same error-correction properties. As a result, the present invention provides a practical and efficient mechanism for error correction. In particular, the system's ability to correct arbitrary double-bit errors is very useful because signaling errors are often introduced at the high data rates associated with modern clocked memories.

The present invention uses a code which is defined in the '296 patent. This code provides guaranteed component failure correction prior to a known component failure. In this code, the bits being communicated or stored are partitioned into C sets of R bits each, which are viewed as forming an array with R rows and C columns, such that the bits affected by the failure of a single component are located in a single column. For example, if 576 bits are stored on 18 DRAM chips, with 32 bits per DRAM, the bits can be viewed as forming a 32×18 array where the bits stored on a single DRAM comprise a single column of the array. The rows are numbered 0 through R−1 and the columns are numbered 0 through C−1. Column 0 contains the row-parity checkbits. Moreover, the row-parity checkbit stored in position (r, 0) is the even parity of the bits stored in positions (r, c), where $1 \leq c \leq C-1$.

The inner checkbits in the initial encoding are also defined in the '296 patent. Specifically, R inner checkbits are used where inner checkbit i, $0 \leq i \leq R-1$, is stored in position (i, 1). Associated with each column c, $0 \leq c \leq C-1$, is a unique key, $key_c$, which in the above example is a member of the Galois field $GF(2^{32})$. Each inner checkbit is the even parity of a subset of the R*C bits being communicated or stored. Specifically, the bit in location (r, c), is in the subset of bits covered by inner checkbit i, $0 \leq i \leq R-1$, if and only if bit i of $(key_c * \alpha^r) = 1$, where the multiplication is in $GF(2^R)$ and $\alpha$ is a primitive element of $GF(2^R)$.

Correction of component failure errors can be accomplished whenever the inner syndrome is non-zero by dividing (in $GF(2^R)$) the row syndrome by the inner syndrome to produce $key_c$, where c is the column containing the error. In practice, division in $GF(2^R)$ is difficult to perform in hardware, so it is also possible for the system to simply guess (in parallel) that each column contains the error. The system can then calculate the inner syndrome that results from that guess, and check the calculated inner syndrome against the true inner syndrome.

The keys for columns are selected as described in the '296 patent. In addition, once a failed component has been identified, SEC (single-error correction) can be performed by first using the above technique to attempt to correct the failed component. At this point, if there was a single-bit error in the original data (in addition to the component error), there is now a double-bit error where both bits in error are in the same row and one is in the column corresponding to the failed component. (This second error is "projected" into the failed component by the attempt at correction of the failed component). Next, the system calculates the inner syndrome of the resulting data, and if the inner syndrome is non-zero, the system corrects the remaining two errors by flipping those bits that yield this unique non-zero inner syndrome (assuming the given failed component).

Note that the present invention differs from the invention in the '296 patent because an additional constraint is placed on the selection of the keys. Specifically, the keys are selected so that every inner syndrome produced by two bits in error in the same row is unique. With such a definition of the keys, it is possible to perform double-error correction if the errors are known to be in the same row. Consider the general problem of correcting errors using the above code. First, the row and inner syndromes are calculated. If they are both zero, the data is accepted as being error-free. If the row syndrome is non-zero and the inner syndrome is zero, the error occurs in bits (determined by the row syndrome) within column 0 (which contains the row checkbits and which have a key of 0), and the system corrects these bits. If the row syndrome and column syndrome are both non-zero, the system first attempts to perform component correction as described in the '296 patent. If this attempt succeeds, the correction is complete.

However, if this attempt fails (because there is no key which, when multiplied (in $GF(2^R)$) by the row syndrome, yields the inner syndrome), the system checks the row syndrome. If the row syndrome has exactly two bits set, the system assumes that there is a single-bit error in each of the rows indicated by the row syndrome. The system then determines all of the possible inner syndromes that would result, and if one of them matches the observed inner syndrome, the system performs double-bit error correction by flipping those two bits. (Note that the above property for unique inner syndromes guarantees that this process will be correct.) If none of the keys matches, the system determines that the block of data is uncorrectable. Also, if the row syndrome is non-zero and does not have exactly two bits set, the system determines that the data block is uncorrectable.

Finally, if the row syndrome is zero and the inner syndrome is non-zero, the system attempts to perform double-bit error correction where both errors are in the same row. This is done by accessing a lookup table that provides the unique inner syndrome produced by each such error. If a matching inner syndrome is found, the system corrects the corresponding two bits. Otherwise, the system determines that the block of data is uncorrectable.

The above-mentioned techniques are described in more detail below. But first, we describe an associated computer system.

Computer System

FIG. 1 illustrates a computer system 100 in accordance with an embodiment of the present invention. Computer system 100 can generally include any type of computer system, including, but not limited to, a computer system based on a microprocessor, a mainframe computer, a digital signal processor, a portable computing device, a personal organizer, a cell phone, a device controller, or a computational engine within an appliance. Computer system 100 includes at least one processor 102, a cache memory 104, error-detection-and-correction circuitry 106 and memory modules 108 and 109. Processor 102 can include any type of computational engine that executes code and manipulates data. Cache memory 104 can include one or more caches or levels of caches, which store blocks of data (cache lines) which have recently been accessed or are likely to be accessed in the near future.

Error-detection-and-correction circuitry 106 includes circuitry that performs error-correction and error-detection operations for blocks of data which are retrieved from memory modules 108-109 and which are stored in cache memory 104. Note that the error-correction and error-detection operations can additionally (or alternatively) be performed when blocks of data in cache memory 104 are accessed by processor 102 from cache memory 104. One embodiment of error-detection-and-correction circuitry 106 is described in the '296 patent (U.S. Pat. No. 7,188,296, entitled "ECC for Component Failures Using Galois Fields," by inventor Robert E. Cypher, filed 30 Oct. 2003), which is hereby incorporated by reference to provide details about how to implement such circuitry.

Memory modules 108 and 109 include memory components, which can be semiconductor chips containing random-access memory. More specifically, memory module 108 includes memory components (MCs) 111-119 and memory module 109 includes MCs 121-129.

Block Structure

Figure 2:
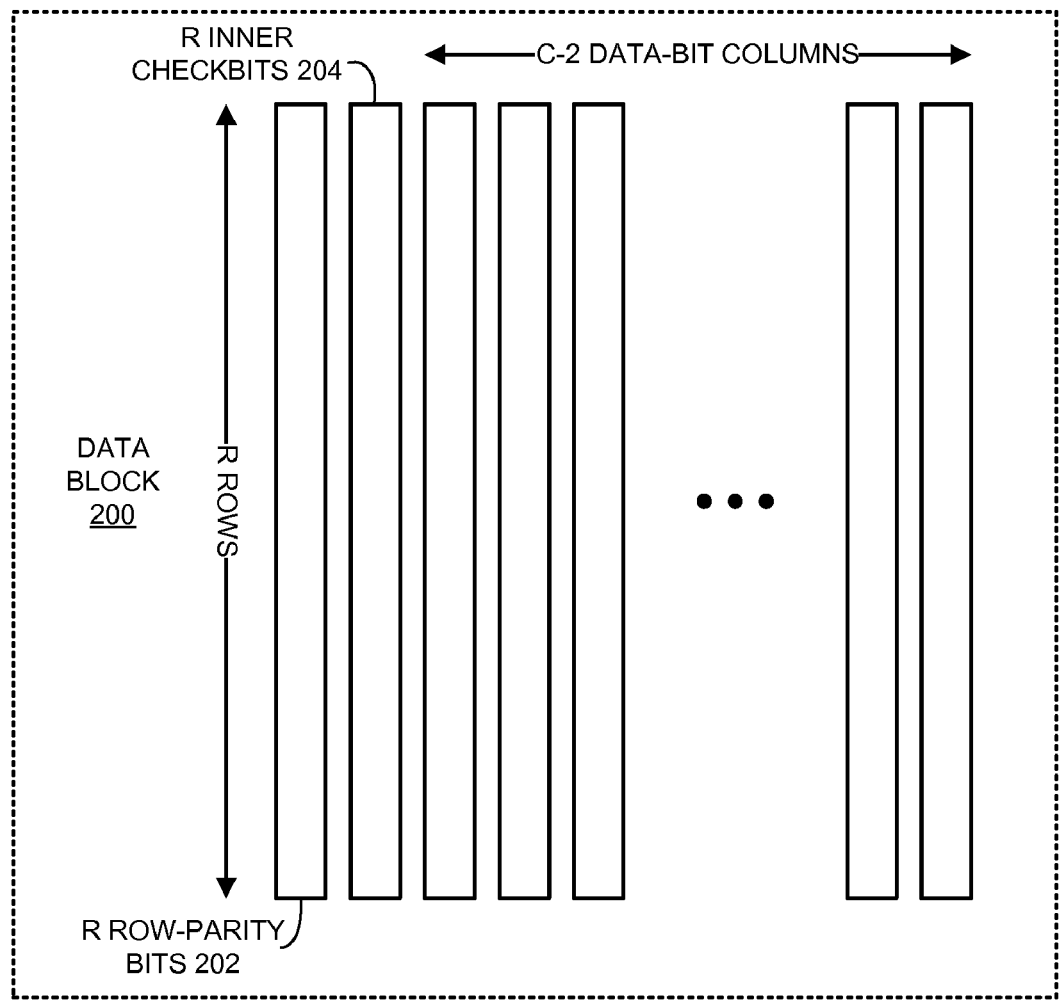
FIG. 2 illustrates a data block in accordance with an embodiment of the present invention.

FIG. 2 illustrates the structure of an exemplary data block 200, which contains a codeword for a code that facilitates error correction and error detection in accordance with an embodiment of the present invention. As mentioned above, data block 200 includes an array of bits logically organized into R rows and C columns.

The C columns include (1) a row-checkbit column containing row-parity bits 202 for each of the R rows, (2) an inner-checkbit column containing R inner checkbits 204, and (3) C-2 data-bit columns containing databits. An exemplary embodiment of the present invention uses the parameters R=32 and C=18. Moreover, each column is stored in a different memory component, and the checkbits are generated from the databits to provide block-level detection and correction for a failed memory component. The row-checkbit column contains a row-parity bit for each of the R rows in the block. In contrast, the inner-checkbit column contains inner checkbits which are defined to cover bits in the array in accordance with a set of check vectors, wherein each check vector is associated with a different bit in the array and is an element of a Galois field $GF(2^R)$. These check vectors are derived from a set of keys which are unique elements of $GF(2^R)$, wherein each key is associated with a different column of the array. The check vector for a row r of a column c is the product in $GF(2^R)$ of the key for the column c and $\alpha^r$, wherein $\alpha$ is a primitive element of $GF(2^R)$.

Techniques for using these checkbits to provide component failure detection and correction are described in U.S. Pat. No. 7,188,296, entitled "ECC for Component Failures Using Galois Fields," by inventor Robert E. Cypher, filed 30 Oct. 2003 (referred to as "the '296 patent). This related application is hereby incorporated by reference.

Selecting Keys

When keys are selected for the columns, it is advantageous to ensure that the inner syndrome which results from any two-bit error in the same row is unique. This can involve using a "greedy" technique which starts with a single column and an associated single key, and selects additional keys which are consistent with the property. For example, assuming that a data block has R=32 rows and C=18 columns, the following set of 32-bit keys expressed in hexadecimal has the desired property.

TABLE 1

| | |
|---|---|
| Column 0 - | 0x00000000 |
| Column 1 - | 0x00000001 |
| Column 2 - | 0x04C11DB7 |
| Column 3 - | 0x490D678D |
| Column 4 - | 0xF200AA66 |
| Column 5 - | 0xE8A45605 |
| Column 6 - | 0x17D3315D |
| Column 7 - | 0xC5B9CD4C |
| Column 8 - | 0xCD8C54B5 |
| Column 9 - | 0x75BE46B7 |
| Column 10 - | 0xAB40B71E |
| Column 11 - | 0x569700E5 |
| Column 12 - | 0xC053585D |
| Column 13 - | 0x8C3828A8 |
| Column 14 - | 0x766F1B78 |
| Column 15 - | 0x64BF7A9B |
| Column 16 - | 0xD3504EC7 |
| Column 17 - | 0xE6228B11 |

Accessing a Block of Memory

Figure 3:
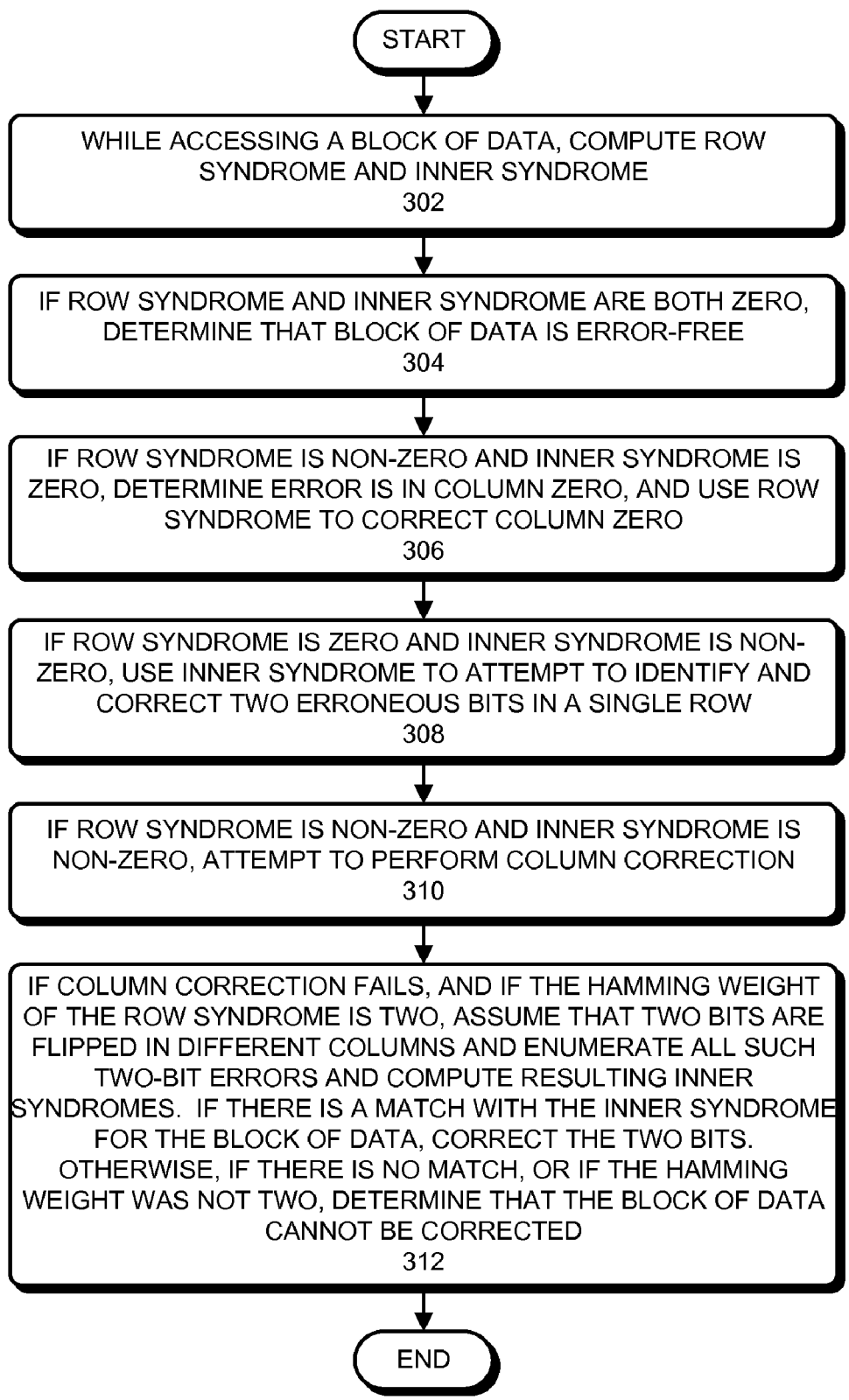
FIG. 3 presents a flow chart illustrating the process of accessing a block of data in accordance with an embodiment of the present invention.

FIG. 3 presents a flow chart illustrating the process of accessing a block of memory in accordance with an embodiment of the present invention. When the memory system accesses a block of data, the memory system re-computes the row syndrome and the inner syndrome from the databits for the block of data (step 302). (This process is described in more detail below with reference to FIG. 4.) If the row syndrome and the inner syndrome are both zero, the system determines that the block of data is error-free (step 304).

On the other hand, if the row syndrome is non-zero and the inner syndrome is zero, the system determines that the error is in column zero because the key for column zero has a zero value. Hence, errors in column zero will not affect the inner syndrome. The system then uses the row syndrome to identify and correct erroneous bits in column zero (step 306).

Conversely, if the row syndrome is zero and the inner syndrome is non-zero, the system assumes that there are two erroneous bits in the same row that are canceling each other out to produce the zero row syndrome. In this case, the system attempts to identify and correct the two erroneous bits in the same row (step 308). (This process is described in more detail below with reference to FIG. 5.)

Finally, if both the row syndrome and column syndrome are non-zero, the system attempts to perform column correction (step 310). (This process is described in more detail below with reference to FIG. 6.) If the attempted column correction in step 310 fails, and if the Hamming weight (the number of one bits) in the row syndrome is two, the system assumes that two bits are flipped in different columns (because if they were in the same column, the preceding column-correction operation would have been successful). The system then enumerates all such two-bit errors and computes the resulting inner syndromes. (Note that for 18 columns, there will be 18×17 computed inner syndromes.) If the inner syndrome matches one of the computed inner syndromes, the system corrects the associated two bits. Otherwise, if there is no match or if the Hamming weight is not equal to two, the system determines that the block of data cannot be corrected (step 312).

The above technique relies on the assumption that each computed inner syndrome associated with each of the possible 18×17 two-bit errors is unique. This assumption can be proved by contradiction as follows. Assume that the row syndrome indicates there is an error in a first row and a second row. Also, assume that there exists a location A in the first row and a location B in the second row, and that the inner syndrome for the failure of A and B matches the inner syndrome computed from the databits. Now, for the sake of contradiction, assume there exists an A' in the first row and a B' in the second row which generate the same inner syndrome. Now consider the inner syndrome that results from all four bits failing. This has to be zero if the inner syndromes are the same. This means the inner syndrome for A and A' must match the inner syndrome for B and B'. However, this cannot be true because the keys were initially selected to ensure that the inner syndrome which results from any two-bit error in the same row is unique.

Computing Row Syndrome and Inner Syndrome

Figure 4:
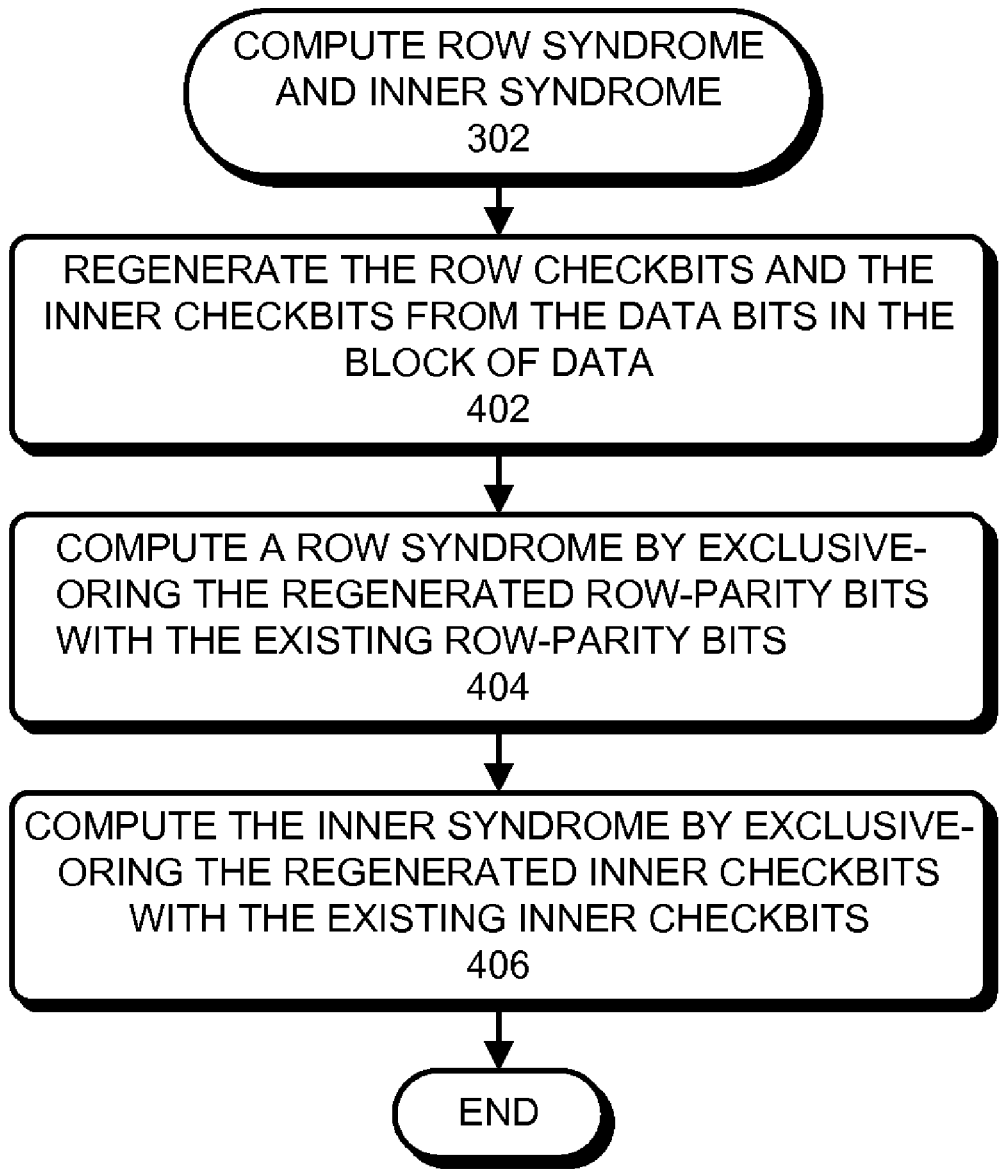
FIG. 4 presents a flow chart illustrating how the row syndrome and the inner syndrome are computed in accordance with an embodiment of the present invention.

FIG. 4 presents a flow chart illustrating how the row syndrome and inner syndrome are computed in accordance with an embodiment of the present invention. (This flow chart illustrates some of the operations involved in performing step 302 of FIG. 3.) First, the system regenerates the row-parity bits and the inner checkbits from the databits in the block of data (step 402). Next, the system computes the row syndrome by exclusive-ORing the regenerated row-parity bits with the existing row-parity bits (step 404). The system then computes the inner syndrome by exclusive-ORing the regenerated inner checkbits with the existing inner checkbits (step 406).

Using the Row Syndrome to Correct Two Bits in the Same Row

Figure 5:
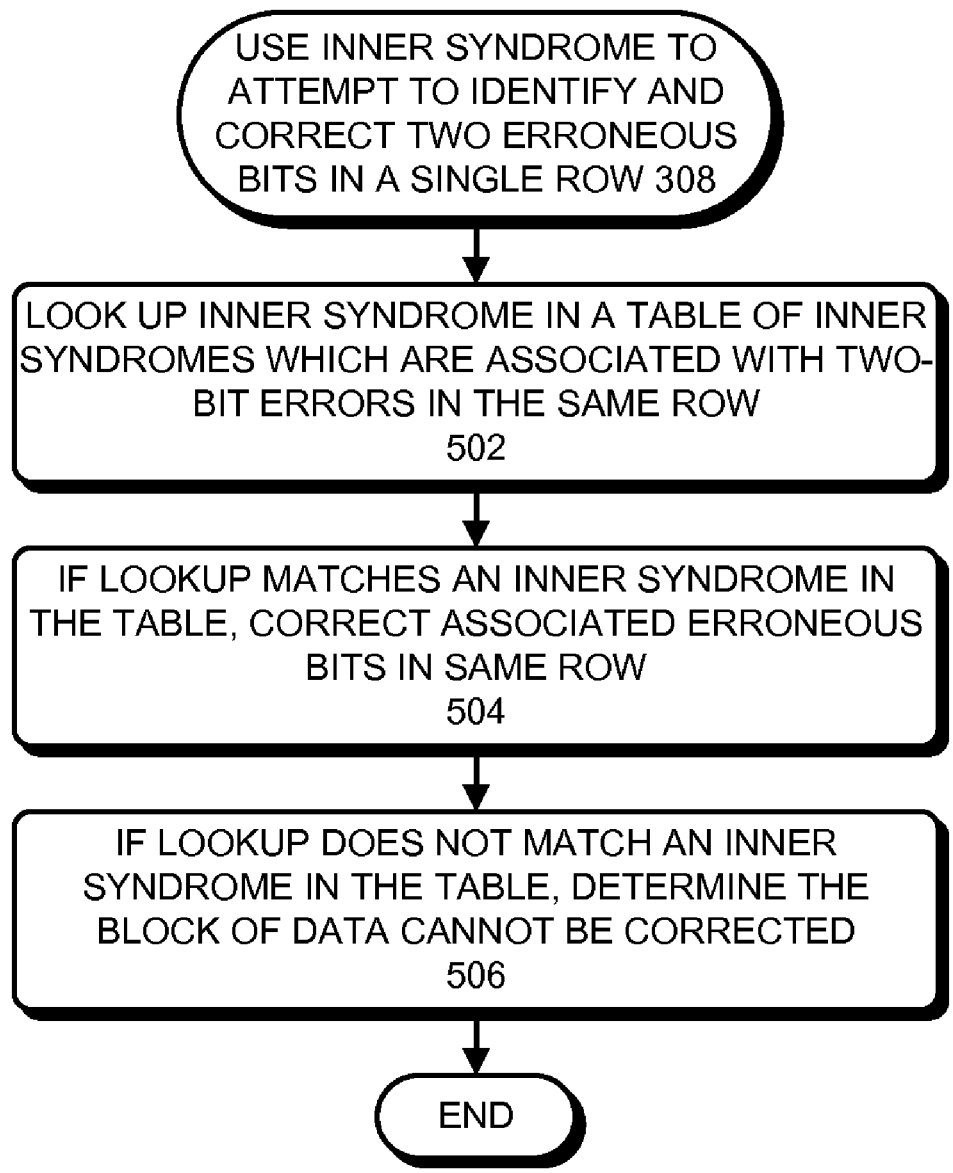
FIG. 5 presents a flow chart illustrating how the inner syndrome can be used to correct two erroneous bits in a single row in accordance with an embodiment of the present invention.

FIG. 5 presents a flow chart illustrating how the inner syndrome can be used to correct two erroneous bits in a single row in accordance with an embodiment of the present invention. (This flow chart illustrates some of the operations involved in performing step 308 of FIG. 3.) At the start of the process, the system assumes that there exist two single-bit errors in the same row. The system then looks up the inner syndrome in a table containing precomputed unique inner syndromes for all possible two-bit errors in the same row (step 502). If the inner syndrome matches a unique inner syndrome in the table, the system corrects the two associated erroneous bits (step 504). Otherwise, if the lookup does not match an inner syndrome, the system determines that the block of data cannot be corrected (step 506).

Attempting to Perform Column Correction

Figure 6:
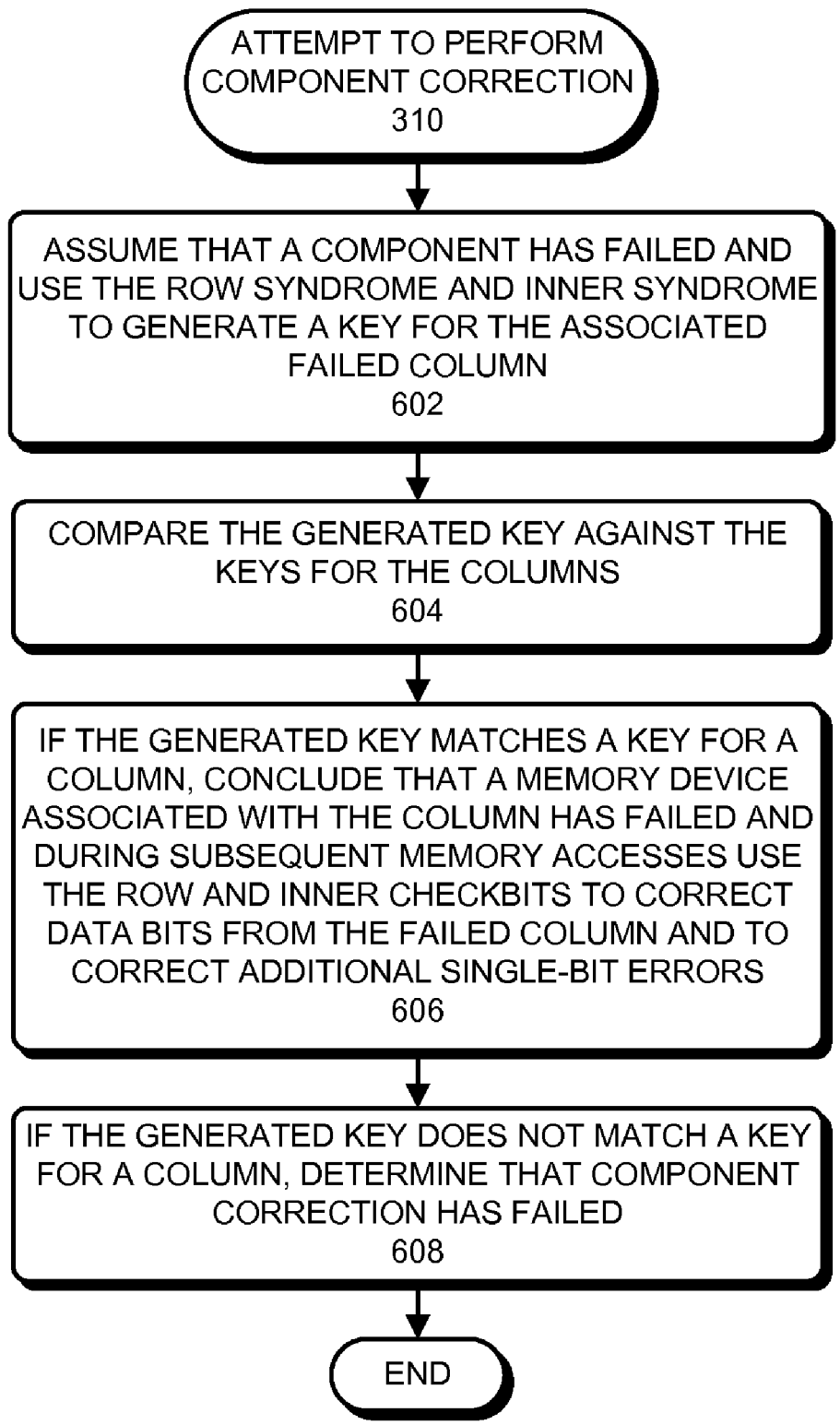
FIG. 6 presents a flow chart illustrating the process of attempting to perform column correction in accordance with an embodiment of the present invention.

FIG. 6 presents a flow chart illustrating the process of attempting to perform column correction in accordance with an embodiment of the present invention. (This flow chart illustrates some of the operations involved in performing step 310 of FIG. 3.) The system starts by assuming that a memory component has failed and uses the row syndrome and the inner syndrome to generate a key for the associated failed column (step 602). Note that generating the key can involve performing a division operation in $GF(2^X)$ of the inner syndrome by the row syndrome.

The system then compares the generated key against the keys for the columns (step 604). If the generated key matches a key for a column, the system determines that the memory device associated with the column has failed, and during subsequent memory accesses the system uses the row and inner checkbits to correct databits from the failed column and to correct additional single-bit errors, if necessary (step 606). On the other hand, if the generated key does not match any of the column keys, the system determines that component correction has failed (step 608).

In an alternative embodiment, instead of generating the key by performing the division operation (which may be hard to perform), the system can perform multiplication operations in $GF(2^X)$ between the row syndrome and each key in the set of keys. The system can then compare the inner syndrome against results of the multiplication operations. If the inner syndrome matches a result, the system determines that the key associated with the result is the key for the column associated with the failed memory component.

Accessing a Block of Data after Column Correction

Figure 7:
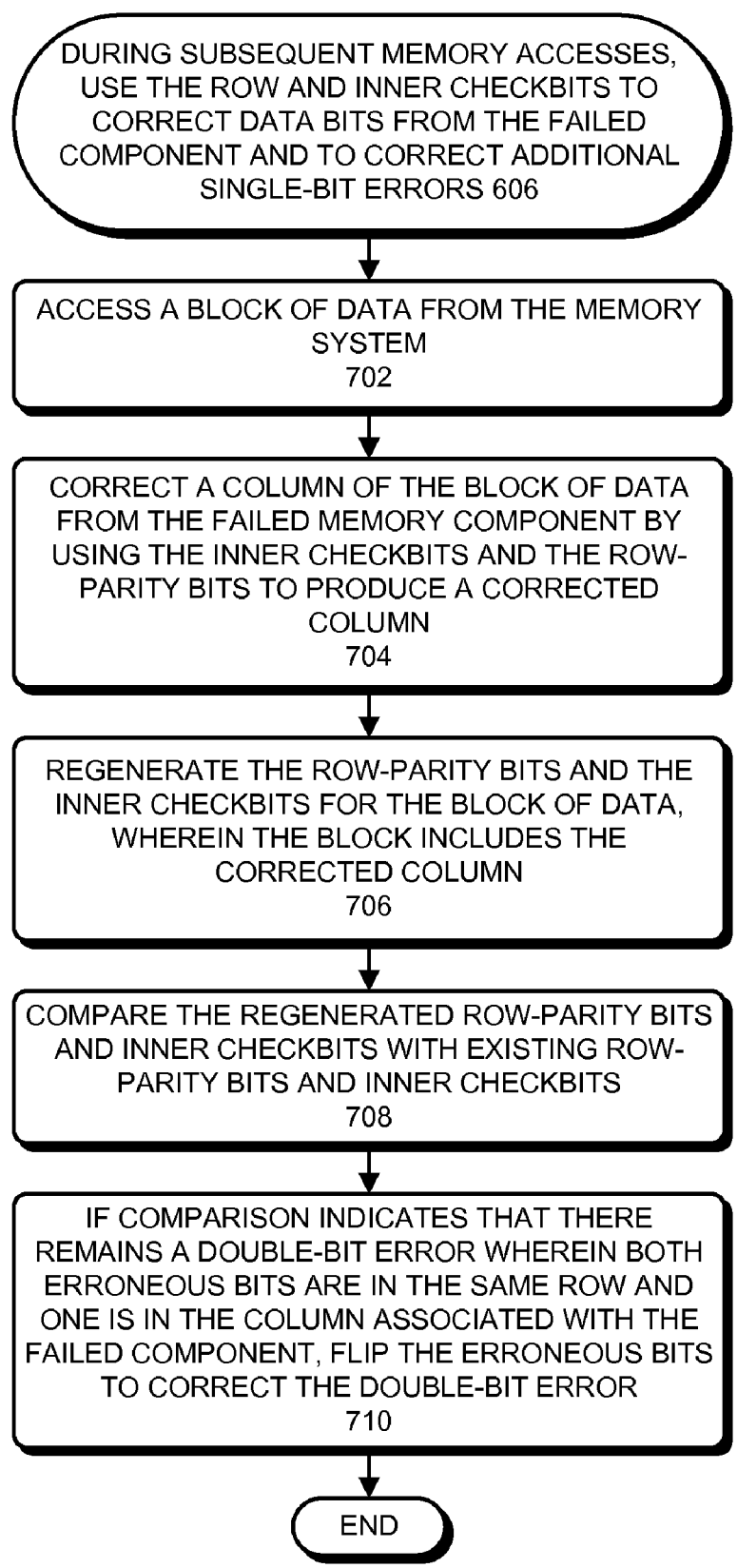
FIG. 7 presents a flow chart illustrating the process of accessing a data block after a component-failure correction in accordance with an embodiment of the present invention.

FIG. 7 presents a flow chart illustrating the process of accessing a data block after a component correction in accordance with an embodiment of the present invention. (This flow chart illustrates some of the operations involved in performing step 606 of FIG. 6.) The system starts by accessing a block of data from the memory system (step 702). The system then corrects a column of the block of data by using the inner checkbits and the row-parity bits to produce a corrected column (step 704). This can involve using the row syndrome (which was generated while determining which component had failed) to identify erroneous bits in the column associated with the failed component and then flipping the identified erroneous bits to produce the corrected partial column.

Next, the system regenerates the row-parity bits and the inner checkbits for the block of data including the corrected column (step 706). The system then compares the regenerated row-parity bits and inner checkbits with existing row-parity bits and inner checkbits (step 708). If this comparison indicates that there remains a double-bit error wherein both erroneous bits are in the same row and one is in the column associated with the failed component, the system flips the erroneous bits to correct the double-bit error (step 710).

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A method for providing guaranteed component-failure correction and double-error correction in a memory system, the method comprising:
 accessing a block of data from the memory system, wherein each block of data in the memory system includes an array of bits logically organized into R rows and C columns, including a row-checkbit column containing row checkbits for each of the R rows, an inner-checkbit column containing R inner checkbits, and C-2 data-bit columns containing databits, wherein each column is stored in a different memory component, and wherein the checkbits are generated from the databits to provide block-level correction for a failed memory component, and double-error correction for errors in different memory components;
 calculating a row syndrome and an inner syndrome for the block of data, wherein the inner syndrome that results from any two-bit error in the same row is unique;
 if the row syndrome and the inner syndrome are both non-zero, determining from the row syndrome and the inner syndrome whether errors in the block of data are associated with a failed memory component; and
 if not, and if exactly two bits in the row syndrome are one, assuming that there exists a single-bit error in each of the two rows which have a row syndrome of one, and comparing the calculated inner syndrome against inner syndromes for all possible combinations of one-bit errors occurring in each of the two rows, and if the comparison matches a given inner syndrome, correcting the two bits associated with the given inner syndrome.

2. The method of claim 1, wherein if the row syndrome and the inner syndrome are both zero, determining that the block of data is error-free.

3. The method of claim 1, wherein if the row syndrome is non-zero and the inner syndrome is zero, determining that erroneous bits only exist in the row-checkbit column, and using the row syndrome to identify and correct the erroneous bits.

4. The method of claim 1, wherein if the row syndrome is zero and the inner syndrome is non-zero, assuming that two single-bit errors exist in the same row and,
 comparing the inner syndrome against unique inner syndromes for all possible two-bit errors in the same row;
 if the inner syndrome matches a unique inner syndrome for a two-bit error in the same row, correcting the two-bit error; and
 otherwise, determining that the block of data cannot be corrected.

5. The method of claim 1, wherein if the inner syndrome does not match any of the inner syndromes for all possible combinations of one-bit errors occurring in each of the two rows, the method comprises determining that the block of data cannot be corrected.

6. The method of claim 1, wherein if the errors in the block of data are not associated with a failed memory component, and if the row syndrome does not have exactly two bits set to one, determining that the block of data cannot be corrected.

7. The method of claim 1, wherein if it is determined that the given memory component has failed, the method further comprises:
 using the row syndrome to identify erroneous bits in the given column associated with the given memory component; and
 flipping the identified erroneous bits to correct the given column.

8. The method of claim 1, wherein calculating the row syndrome and the inner syndrome involves:
 regenerating the row-parity bits and the inner checkbits for the block of data from the databits in the block of data;
 computing the row syndrome by exclusive-ORing the regenerated row-parity bits with the existing row-parity bits; and
 computing the inner syndrome by exclusive-ORing the regenerated inner checkbits with the existing inner checkbits.

9. The method of claim 1,
 wherein the row checkbit column contains row-parity bits for each of the R rows in the block; and
 wherein the inner checkbit column contains R inner checkbits which are defined to cover bits in the array in accordance with a set of check vectors, wherein each check vector is associated with a different bit in the array and is an element of a Galois field ($GF(2^X)$), wherein the check vectors are derived from a set of keys which are unique elements of $GF(2^X)$, wherein each key is associated with a different column of the array, and wherein the check vector for a row r of a column c is the product in $GF(2^X)$ of the key for the column c and $\alpha^r$, wherein $\alpha$ is a primitive element of $GF(2^X)$.

10. The method of claim 9, wherein the set of keys are elements of a subfield of $G(2^X)$, wherein the subfield does not contain any $\alpha^i$, where $1 \leq i < R$.

11. The method of claim 9, wherein determining from the row syndrome and the inner syndrome whether errors in the block of data are associated with a failed memory component involves performing a division operation in $GF(2^X)$ of the inner syndrome by the row syndrome, and if the result of the division operation matches a key associated with a given column, determining that a given memory component associated with the given column has failed.

12. The method of claim 9, wherein determining from the row syndrome and the inner syndrome whether errors in the block of data are associated with a failed memory component involves:
- performing multiplication operations in $GF(2^X)$ between the row syndrome and each key in the set of keys;
- comparing the inner syndrome against results of the multiplication operations; and
- if the inner syndrome matches a result, determining that the key associated with the result is the key for the column associated with the failed memory component.

13. A memory system that provides guaranteed component-failure correction and double-error correction, comprising:
- an access mechanism configured to access a block of data from the memory system, wherein each block of data in the memory system includes an array of bits logically organized into R rows and C columns, including a row-checkbit column containing row checkbits for each of the R rows, an inner-checkbit column containing R inner checkbits, and C-2 data-bit columns containing databits, wherein each column is stored in a different memory component, and wherein the checkbits are generated from the databits to provide block-level correction for a failed memory component, and double-error correction for errors in different memory components; and
- an error-handling mechanism configured to,
  - calculate a row syndrome and an inner syndrome for the block of data, wherein the inner syndrome that results from any two-bit error in the same row is unique,
  - if the row syndrome and the inner syndrome are both non-zero, determine from the row syndrome and the inner syndrome whether errors in the block of data are associated with a failed memory component, and
  - if not, and if exactly two bits in the row syndrome are one, assume that there exists a single-bit error in each of the two rows which have a row syndrome of one, and compare the calculated inner syndrome against inner syndromes for all possible combinations of one-bit errors occurring in each of the two rows, and if the comparison matches a given inner syndrome, correct the two bits associated with the given inner syndrome.

14. The memory system of claim 13, wherein if the row syndrome and the inner syndrome are both zero, the error-handling component determines that the block of data is error-free.

15. The memory system of claim 13, wherein if the row syndrome is non-zero and the inner syndrome is zero, the error-handling component determines that erroneous bits only exist in the row checkbit column, and uses the row syndrome to identify and correct the erroneous bits.

16. The memory system of claim 13, wherein if the row syndrome is zero and the inner syndrome is non-zero, the error-handling component:
- assumes that two single-bit errors exist in the same row, a
- compares the inner syndrome against unique inner syndromes for all possible two-bit errors in the same row,
- if the inner syndrome matches a unique inner syndrome for a two-bit error in the same row, corrects the two-bit error; and
- otherwise, determines that the block of data cannot be corrected.

17. The memory system of claim 13, wherein if the inner syndrome does not match any of the inner syndromes for all possible combinations of one-bit errors occurring in each of the two rows, the error-handling mechanism determines that the block of data cannot be corrected.

18. The memory system of claim 13, wherein if the errors in the block of data are not associated with a failed memory component, and if the row syndrome does not have exactly two bits set to one, the error-handling mechanism determines that the block of data cannot be corrected.

19. The memory system of claim 13, wherein if the error-handling mechanism determines that the given memory component has failed, the error-handling mechanism is configured to:
- use the row syndrome to identify erroneous bits in the given column associated with the given memory component; and
- flip the identified erroneous bits to correct the given column.

20. A computer system with a memory that provides guaranteed component-failure correction and double-error correction, comprising:
- one or more processors; and
- a memory system;
- wherein the memory system includes an access mechanism configured to access a block of data from the memory system, wherein each block of data in the memory system includes an array of bits logically organized into R rows and C columns, including a row checkbit column containing row checkbits for each of the R rows, an inner checkbit column containing R inner checkbits, and C-2 data-bit columns containing databits, wherein each column is stored in a different memory component, and wherein the checkbits are generated from the databits to provide block-level correction for a failed memory component, and double-error correction for errors in different memory components; and
- wherein the memory system includes an error-handling mechanism configured to,
  - calculate a row syndrome and an inner syndrome for the block of data, wherein the inner syndrome that results from any two-bit error in the same row is unique,
  - if the row syndrome and the inner syndrome are both non-zero, determine from the row syndrome and the inner syndrome whether errors in the block of data are associated with a failed memory component, and
  - if not, and if exactly two bits in the row syndrome are one, assume that there exists a single-bit error in each of the two rows which have a row syndrome of one, and compare the calculated inner syndrome against inner syndromes for all possible combinations of one-bit errors occurring in each of the two rows, and if the comparison matches a given inner syndrome, correct the two bits associated with the given inner syndrome.

\* \* \* \* \*